(12) United States Patent
Chen et al.

(10) Patent No.: US 6,965,253 B1
(45) Date of Patent: Nov. 15, 2005

(54) REDUCED-CAPACITANCE BUS SWITCH IN ISOLATED P-WELL SHORTED TO SOURCE AND DRAIN DURING SWITCHING

(75) Inventors: Wensong Chen, San Jose, CA (US); Paul C. F. Tong, San Jose, CA (US); Ping Ping Xu, San Jose, CA (US); Zhi Qing Liu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 9 days.

(21) Appl. No.: 10/710,298

(22) Filed: Jun. 30, 2004

(51) Int. Cl.$^7$ ................................ H03K 19/0175
(52) U.S. Cl. ..................... 326/81; 326/83; 327/535
(58) Field of Search ............... 326/26, 27, 80, 326/81; 327/535–537

(56) References Cited

U.S. PATENT DOCUMENTS

| | | | | |
|---|---|---|---|---|
| 5,751,168 A | 5/1998 | Speed, III et al. | ............ | 326/83 |
| 5,808,502 A | 9/1998 | Hui et al. | ............ | 327/333 |
| 6,034,553 A | 3/2000 | Kwong | ............ | 326/86 |
| 6,052,019 A | 4/2000 | Kwong | ............ | 327/437 |
| 6,100,557 A | 8/2000 | Hung et al. | ............ | 257/299 |
| 6,175,263 B1 | 1/2001 | Lee et al. | ............ | 327/536 |
| 6,194,952 B1 * | 2/2001 | Shigehara | ............ | 327/534 |
| 6,236,259 B1 * | 5/2001 | Goodell et al. | ............ | 327/534 |
| 6,249,458 B1 | 6/2001 | Shokouhi et al. | ....... | 365/185.23 |
| 6,320,408 B1 | 11/2001 | Kwong | ............ | 326/31 |
| 6,452,438 B1 * | 9/2002 | Li | ............ | 327/536 |
| 6,559,703 B1 | 5/2003 | Kwong et al. | ............ | 327/313 |
| 6,608,517 B1 | 8/2003 | Chow et al. | ............ | 327/365 |
| 6,642,773 B2 * | 11/2003 | Lin et al. | ............ | 327/536 |
| 6,670,829 B1 | 12/2003 | Chow | ............ | 326/83 |
| 6,724,592 B1 | 4/2004 | Tong et al. | ............ | 361/56 |
| 2004/0189345 A1 * | 9/2004 | Ker et al. | ............ | 326/83 |

* cited by examiner

*Primary Examiner*—Don Le
(74) *Attorney, Agent, or Firm*—Stuart T. Auvinen

(57) ABSTRACT

A bus switch has reduced input capacitance. Parasitic source-to-well and drain-to-well capacitors are shorted by well-shorting transistors, eliminating these parasitic capacitances. The well-shorting transistors are turned on when the bus-switch transistor is turned on, but are turned off when the bus-switch transistor is turned off and the bus switch isolates signals on its source and drain. The isolated P-well under the bus-switch transistor and the well-shorting transistors is not tied to ground. Instead the isolated P-well is floating when the bus-switch transistor is turned on. When the bus-switch transistor is turned off, the underlying isolated P-well is driven to ground by a biasing transistor in another P-well. Since the isolated P-well has a much lower doping than the N+ source and drain, the capacitance of the well-to-substrate junction is much less than the source-to-well capacitance. Thus input capacitance is reduced, allowing higher frequency switching.

19 Claims, 5 Drawing Sheets

REDUCED-CAPACITANCE BUS SWITCH IN ISOLATED P-WELL SHORTED TO SOURCE AND DRAIN DURING SWITCHING

BACKGROUND OF INVENTION

This invention relates to semiconductor bus switches, and more particularly to isolated wells under bus-switch transistors.

Bus switches are often used in networking and other applications. For high-speed applications, bus switches using metal-oxide-semiconductor (MOS) technology should have both low on-resistance and capacitance to reduce the delay through the switch. The source and drain nodes of a bus-switch transistor connect to the busses while the gate is controlled by a bus-connecting enable signal.

The terminals of bus-switch transistors may be biased in a variety of ways to prevent latch-up or damage and to reduce sensitivity to glitches and other system or environmental factors. See for example "Parallel Micro-Relay Bus Switch for Computer Network Communication with Reduced Crosstalk and Low On-Resistance using Charge Pumps", U.S. Pat. No. 5,808,502, and "Bus Switch Having Both P- and N-Channel Transistors for Constant Impedance Using Isolation Circuit for Live-Insertion when Powered Down", U.S. Pat. No. 6,034,553. Also see U.S. Pat. No. 6,052,019 for "Undershoot-Isolating MOS Bus Switch", "Bi-Directional Undershoot-Isolating Bus Switch with Directional Control", U.S. Pat. No. 6,559,703, and "Live-Insertion PMOS Biasing Circuit for NMOS Bus Switch", U.S. Pat. No. 6,608,517.

FIG. 1 shows a prior-art bus switch. Bus-switch transistor 10 can isolate bus A from bus B or can connect them together. The drain of bus-switch transistor 10 is connected to terminal A, while the source is connected to terminal B. Terminals A, B are typically input-output (I/O) pads of a semiconductor chip that contains one or more bus-switches. Drains and sources are terms that are interchangeable, depending on the applied biases of A, B.

An enable signal EN is applied to or generated by the chip, and is buffered by inverters 16, 18 to drive gate-enable signal GEN. Signal GEN is applied to the gate of bus-switch transistor 10. When EN is high, bus-switch transistor 10 turns on, connecting A and B. When EN is low, bus-switch transistor 10 turns off, isolating A from B.

As new electronic systems operate at higher and higher speeds, such as the Giga-hertz (GHz) range, such bus-switch transistors must also operate at the higher speeds. Capacitances need to be charged and discharged at the higher GHz rates. When capacitances are relatively large, such charging and discharging can limit the frequency of operation of the device.

Since terminals A, B are connected to external pins of the semiconductor chip housing bus-switch transistor 10, larger than minimum-size geometries are needed as protection against electro-static-discharges (ESD) to prevent damage to the device. The source and drain regions of bus-switch transistor 10 are usually enlarged to provide additional protection against ESD damage. This increased source/drain size leads to larger parasitic capacitances in bus-switch transistor 10.

For example, drain-to-well capacitor 14 is formed between the N+ source of bus-switch transistor 10 and the P-well or p-type substrate under the drain. The P-well is often grounded, so as the drain voltage changes as the external signal on A changes, drain-to-well capacitor 14 must be charged and discharged. When the switch is on, source-to-well capacitor 12 must also be charged.

FIG. 2 is a cross-section of a bus-switch transistor. Bus-switch transistor 10 is formed in P-well 17, which is biased to ground by a P+ tap. The N+ drain of bus-switch transistor 10 is connected to external bus signal A while the N+ source is connected to external signal B. The gate of bus-switch transistor 10 is driven by gate-enable signal GEN. The n-type substrate 94 is connected to power (Vcc) by N+ tap 92.

Drain-to-well capacitor 14 (FIG. 1) is formed between the N+ drain (connected to signal A) of bus-switch transistor 10 and grounded P-well 17 under the drain. Source-to-well capacitor 12 is formed between the N+ source (connected to signal B) of bus-switch transistor 10 and grounded P-well 17 under the source. A large size for the MOS transistors is needed for low on-resistance with high performance switches. At very, very high frequencies these capacitances can limit operation.

The parasitic capacitances of drain-to-well capacitor 14 and source-to-well capacitor 12 increase the input capacitance measured at terminals A, B since larger-than-minimum size sources and drains are needed for ESD protection. This increased input capacitance is undesirable since it can limit higher-speed operation of bus-switch transistor 10.

What is desired is a bus switch with low on-resistance and reduced input capacitance. A bus switch with reduced source/drain capacitance is desirable to allow operation at higher frequencies, such as in the GHz range.

DETAILED DESCRIPTION

The present invention relates to an improvement in bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that input capacitance can be reduced by shorting the well under the bus-switch transistor to the source or drain. Since both sides of the source-to-well capacitor and the drain-to-well capacitor are connected to the same voltage, these parasitic capacitances no longer have to be charged and discharged.

Instead, the capacitance from the shorted well to the underlying substrate is charged and discharged. Since the P-well has a much lighter doping than the heavily-doped N+ source, the junction or doping profile of the well-to-substrate junction is more gradual than the N+-to-P-well junction. The more gradual doping profile produces a smaller capacitance for the well-to-substrate junction than for the N+ source-to-well junction. Thus capacitance per unit area is reduced. Although the well is larger in area than the source/drain, the reduction in capacitance per unit area can offset the increase in area.

The well is actively shorted to source and drains when the bus-switch transistor is turned on, but biased to ground when the bus-switch transistor is turned off.

Figure 1:
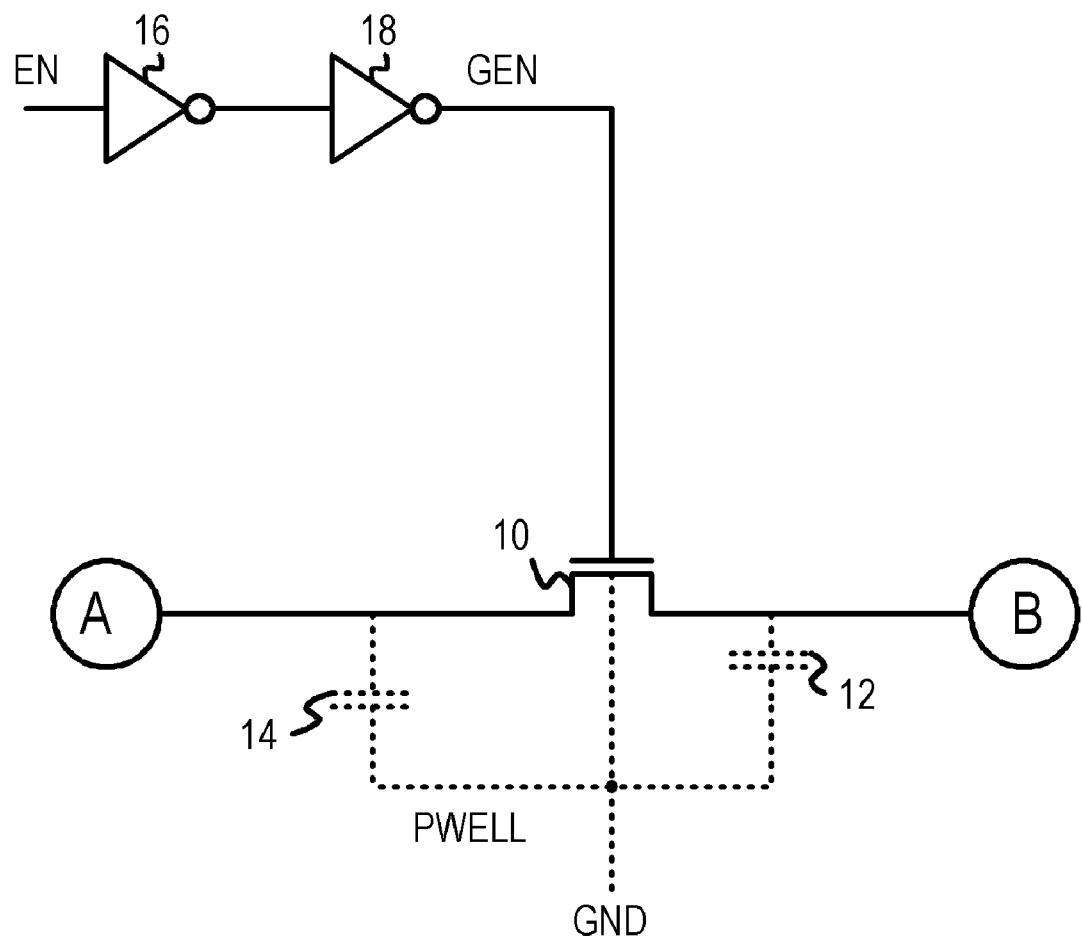
FIG. 1 shows a prior-art bus switch.
Figure 2:
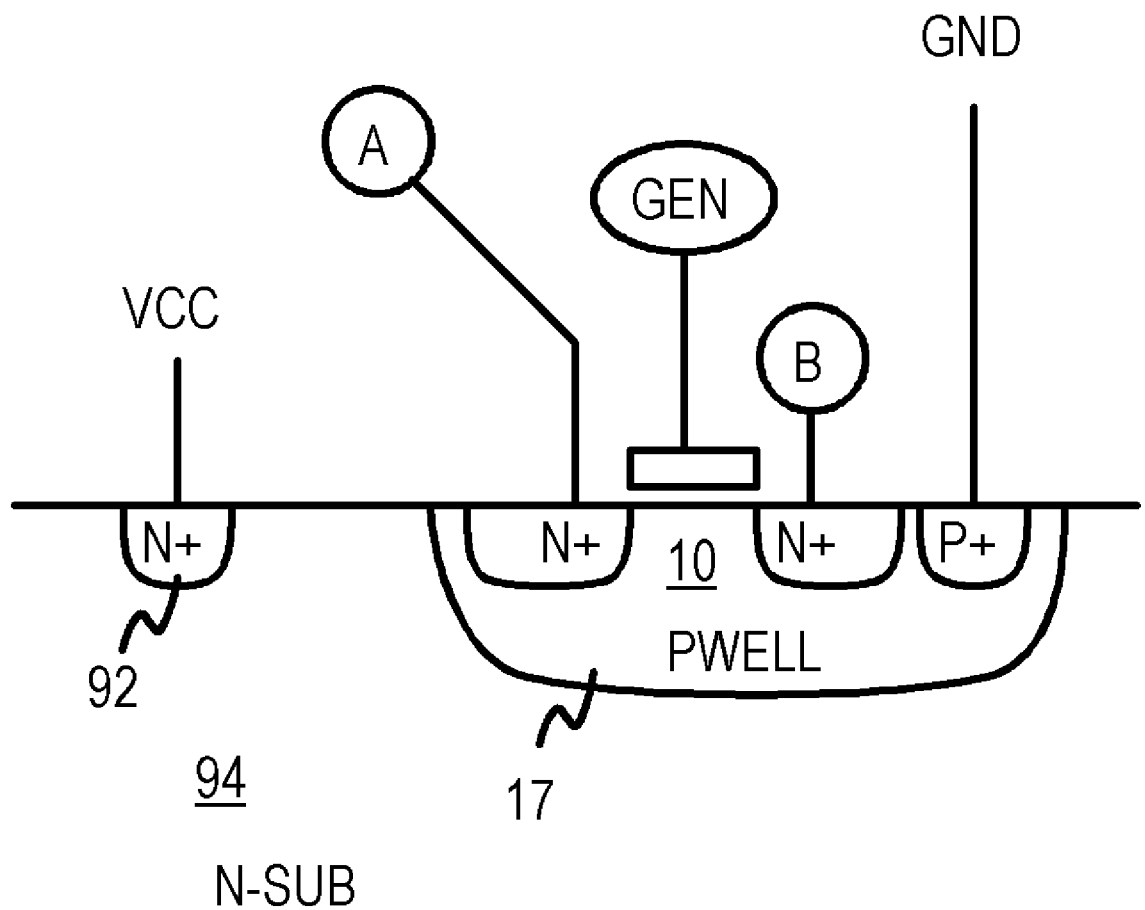
FIG. 2 is a cross-section of a bus-switch transistor.
Figure 3:
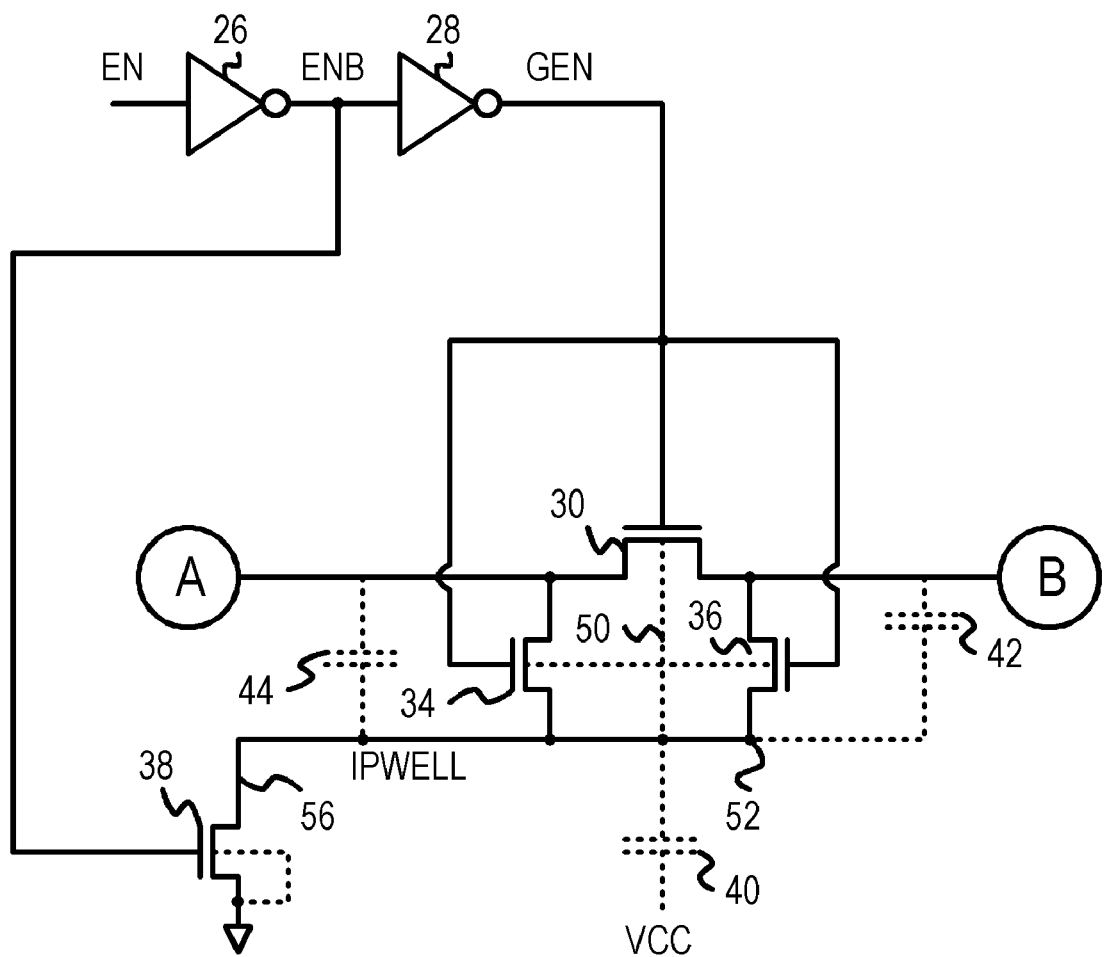
FIG. 3 is a schematic of a bus-switch with an underlying P-well that is shorted to the source/drain during switching.

FIG. 3 is a schematic of a bus-switch with an underlying P-well that is shorted to the source/drain during switching. Bus-switch transistor 30 has a drain connected to bus signal A and a source connected to bus signal B. Bus signals A, B are external signals such as segments of a bus. Inverters 26, 28 buffer enable signal EN to generate ENB and gate-enable GEN. Gate enable GEN is applied to the gate of bus-switch transistor 30, but is also applied to the gates of well-shorting transistors 34, 36.

Isolated P-well 50 is the substrate terminals of bus-switch transistor 30 and well-shorting transistors 34, 36, since all are formed in the same isolated P-well. Parasitic well-to-substrate capacitor 40 is formed between isolated P-well 50 and the underlying N-type substrate or N-well.

When enable EN is low, gate-enable GEN is also low, causing bus-switch transistor 30 to remain off. This isolates signal A from signal B. Isolated P-well 50 is biased to ground by biasing transistor 38, which has its gate driven high by inverse-enable signal ENB. The drain of biasing transistor 38 connects to isolated P-well 50 such as using metal line 56 to a P+ tap, while the source of biasing transistor 38 connects to ground. Biasing transistor 38 can be formed in another P-well that is grounded and otherwise isolated from isolated P-well 50.

When EN is driven high, biasing transistor 38 turns off, floating isolated P-well 50. Bus-switch transistor 10 turns on, connecting signals A, B together. Well-shorting transistors 34, 36 also turn on, shorting isolated P-well 50 to the source (signal B) and the drain (signal A). While the source and drain can initially have different voltages, current rapidly flows through the channel of bus-switch transistor 30 to equalized the drain and source voltages. Bus-switch transistor 30 is typically a larger transistor with a relatively high current drive, so equalization is fast.

Isolated P-well 50 can be biased through one or more P+ taps 52, and can have metal lines connecting the taps together and to metal line 56 near biasing transistor 38.

Since well-shorting transistor 34 turns on, both terminals ("plates") of drain-to-well capacitor 44 are at the same voltage and shorted together. Thus little or no charging current is absorbed by drain-to-well capacitor 4. The input capacitance of input A does not see the full capacitance of drain-to-well capacitor 44 since its two sides are shorted together.

Likewise, when well-shorting transistor 36 turns on, the two sides of source-to-well capacitor 42 are shorted together, eliminating most of the capacitance of source-to-well capacitor 42 from the input capacitance measured at chip terminal B.

Instead, currents from the inputs charge and discharge well-to-substrate capacitor 40. Input current from signal A passes through well-shorting transistor 34 to isolated P-well 50 to charge well-to-substrate capacitor 40. Input current from signal B passes through well-shorting transistor 36 to isolated P-well 50 to charge well-to-substrate capacitor 40. Signals A, B are driven to the same signal when the bus switch is on. Since isolated P-well 50 has a much lower dopant concentration than the N+ sources and drains, the capacitance per unit area is much less. As long as the area of isolated P-well 50 is kept reasonably small, the overall input capacitance is reduced.

Figure 4:
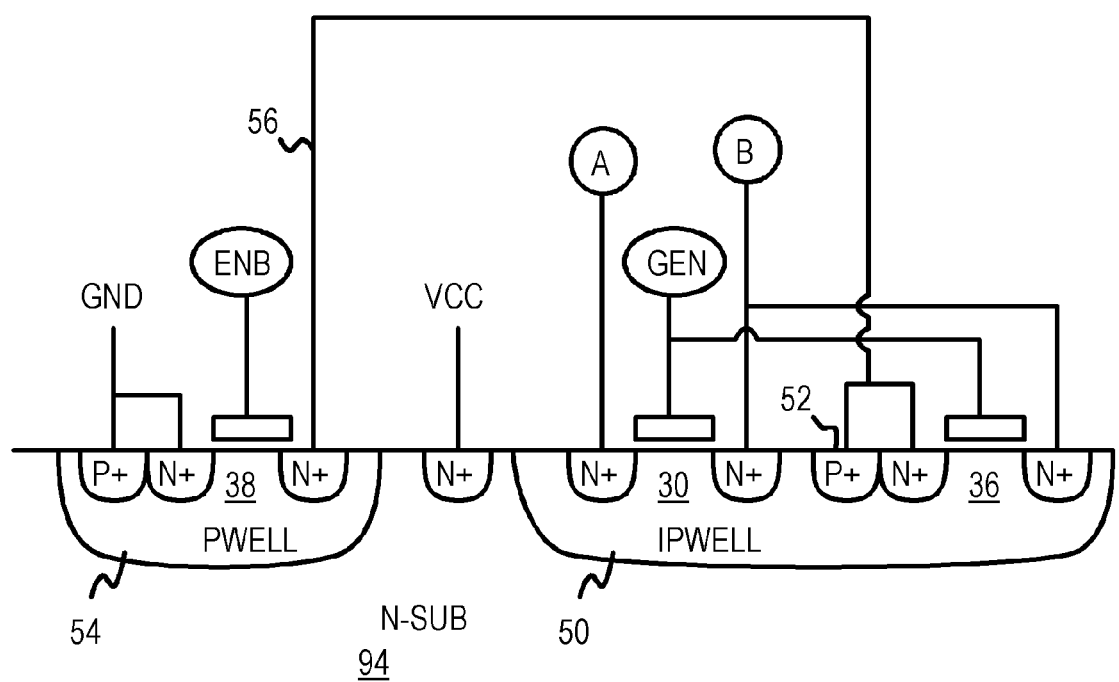
FIG. 4 is a cross-section of a bus-switch with an underlying P-well that is shorted to the source/drain during switching.

FIG. 4 is a cross-section of a bus-switch with an underlying P-well that is shorted to the source/drain during switching. Bus-switching transistor 30 is formed in isolated P-well 50 and has its gate driven by gate-enable GEN and N+ drain connected to signal A and its N+ source connected to signal B.

Input signal B is also connected to the N+ drain of well-shorting transistor 36, which also has its gate driven by gate-enable G. The N+ source of well-shorting transistor 36 is connected to P+ tap 52, causing isolated P-well 50 to be driven from signal B through well-shorting transistor 36 when bus-switch transistor 30 is turned on. Isolated P-well 50 is also driven by well-shorting transistor 34, which is not shown in this limited view.

When bus-switch transistor 30 is turned off, well-shorting transistors 34, 36 are also off, but biasing transistor 38 turns on. The N+ drain of biasing transistor 38 is connected by metal line 56 to P+ tap 52 to drive isolated P-well 50 to ground. Other P+ taps into isolated P-well 50 may also be present.

The N+ source of biasing transistor 38 is connected to ground. A P+ tap to P-well 54 is also grounded to bias P-well 54. P-well 54 and isolated P-well 50 are electrically isolated from each other by n-type substrate 94.

Well-to-substrate capacitor 40 is formed by the junction under isolated P-well 50 to n-type substrate 94. While the junction area is larger than the N+ source/drain to isolated P-well 50 junction, the doping of isolated P-well 50 may be much less, allowing for a reduction in capacitance.

Figure 5:
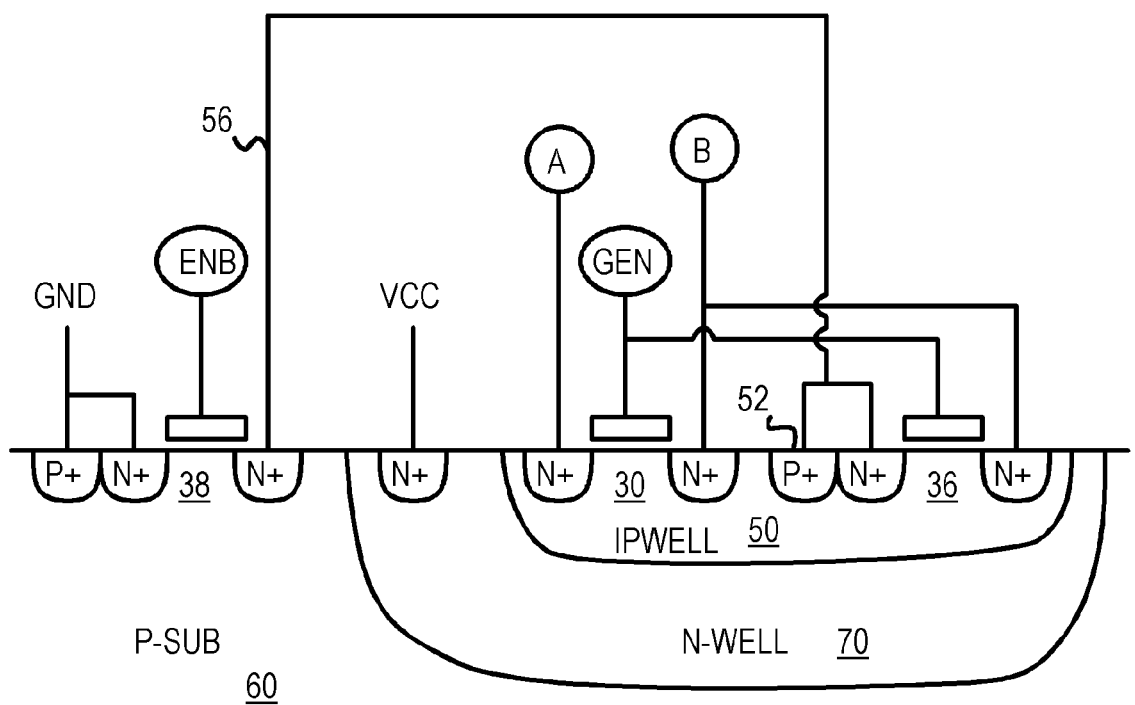
FIG. 5 is a cross section of the bus-switch with an underlying shorted P-well using a triple-well technology.

FIG. 5 is a cross section of the bus-switch with an underlying shorted P-well using a triple-well technology. Some semiconductor processes may use a p-type substrate rather than an n-type substrate. A triple-well process may be used with the invention in that case.

Bus-switch transistor 30 and well-shorting transistors 34, 36 are formed in isolated P-well 50. However, isolated P-well 50 is formed within N-well 70, which is biased to Vcc by an N+ tap. N-well 70 electrically isolates isolated P-well 50 from p-type substrate 60, which is biased to ground by a P+ tap. Thus biasing transistor 38 in p-type substrate 60 is isolated from isolated P-well 50. Metal line 56 allows biasing transistor 38 to bias isolated P-well 50 to ground when bus-switch transistor 30 is not enabled.

ALTERNATE EMBODIMENTS

Several other embodiments are contemplated by the inventors. Various layout arrangements may be used. Additional taps, guard rings, and other structures may be added to the layout, as can ESD or other input-protection devices. Various transistor sizes may be used. Many bus-switch transistors can be integrated together on a semiconductor chip, and can share enable signals or have separate enables. Each bus-switch transistor is formed in a separate well with its own well-shorting transistors.

The well-shorting transistors could be driven by a logically equivalent enable signal that is separately buffered from the enable driving the gate of the bus-switch transistor. Timing could be adjusted slightly if desired.

The invention can be used with a p-channel bus-switch transistor, and p-channel well-shorting transistors and biasing transistor formed in N-wells that are isolated from each other by a p-type substrate. When an n-type substrate is used with p-type channel transistors, a triple-well process may be used. Such complementary structures swap power and ground and p and n type regions.

The well-shorting transistors could be in the same isolated P-well as the bus-switch transistor, or could be in separate isolated P-wells that are electrically connected together by metal lines. Since the isolated P-well is shorted to the source of bus-switch transistor, the body effect is eliminated. This allows a higher current to pass through the bus-switch transistor when its source is above ground. Various trade-offs can be made by the designer. On-resistance can be reduced by increasing the size of the bus-switch transistor, but this increases capacitance. With the invention, reduced input capacitance may allow for larger transistors and lower on-resistance, but without a large input capacitance.

The terms source and drain are interchangeable. At any time the drain is the source/drain region with the higher voltage and the source is the other source/drain region with the lower voltage for n-channel transistors (opposite for p-channel transistors). Since biases can change over time, which source/drain region is the source and which is the drain can also change. The term "source/drain" may be more appropriate, but is not used herein because it is more cumbersome.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A reduced-input-capacitance bus switch comprising:
   a bus-switch transistor, having a gate driven by an enable signal, a drain connected to a first input, and a source connected to a second input;
   an isolated well under the bus-switch transistor, the isolated well isolated from a supply, the supply being a power source or a ground;
   a second well of an opposite polarity type as the isolated well, the second well being formed under and surrounding the isolated well;
   wherein a substrate is a same polarity type as the isolated well;
   a well tap for electrically connecting to the isolated well;
   a first well-shorting transistor, having a gate driven by the enable signal, a drain connected to the first input, and a source connected to the well tap;
   a second well-shorting transistor, having a gate driven by the enable signal, a drain connected to the second input, and a source connected to the well tap; and
   a biasing transistor, formed outside the isolated well, responsive to the enable signal or to an inverse of the enable signal, having a channel between the well tap and the supply that conducts current when the enable signal turns off the bus-switch transistor,
   whereby the isolated well is shorted to the first and second input when the bus-switch transistor is turned on.

2. The reduced-input-capacitance bus switch of claim 1 wherein a parasitic drain-to-well capacitor of the bus-switch transistor is shorted by the first well-shorting transistor when the enable signal turns on the bus-switch transistor;
   wherein a parasitic source-to-well capacitor of the bus-switch transistor is shorted by the second well-shorting transistor when the enable signal turns on the bus-switch transistor,
   whereby parasitic source-to-well and drain-to-well capacitors are shorted to reduce input capacitance.

3. The reduced-input-capacitance bus switch of claim 2 wherein a doping concentration of the isolated well is at least two orders of magnitude less than a doping concentration of the source and the drain of the bus-switch transistor.

4. The reduced-input-capacitance bus switch of claim 1 further comprising:
   a metal line connecting the biasing transistor to the well tap.

5. The reduced-input-capacitance bus switch of claim 4 wherein the well tap comprises a plurality of diffusion well tap regions having a same doping polarity as the isolated well, the well tap also comprising metal conducting lines electrically connecting together two or more of the diffusion well tap regions.

6. The reduced-input-capacitance bus switch of claim 5 wherein the biasing transistor has a drain connected to the well tap and a source connected to the supply.

7. The reduced-input-capacitance bus switch of claim 6 wherein the bus-switch transistor, the first well-shorting transistor, and the second well-shorting transistor are n-channel transistors and wherein the isolated well is a P-well.

8. The reduced-input-capacitance bus switch of claim 7 wherein the supply is the ground.

9. The reduced-input-capacitance bus switch of claim 1 wherein the reduced-input-capacitance bus switch is formed using a triple-well process.

10. The reduced-input-capacitance bus switch of claim 5 wherein the bus-switch transistor, the first well-shorting transistor, and the second well-shorting transistor are p-channel transistors and wherein the isolated well is an N-well, and wherein the supply is the power source.

11. A bus switch comprising:
    floating well means for electrically isolating transistors formed within the floating well means;
    well tap means for electrically connecting to the floating well means;
    second well means for surrounding the isolated well means, the second well means being formed under and of an opposite polarity type as the isolated well means;
    a first input;
    a second input;
    an enable signal;
    bus-switch transistor means, formed within the floating well means, for conducting current between the first input and the second input in response to the enable signal being in an enable state, and for isolating the first input from the second input in response to the enable signal being in an isolating state;

first well-shorting transistor means, formed within the floating well means, for conducting current between the first input and the well tap means in response to the enable signal being in the enable state to equalize voltages of the first input and the floating well means;

second well-shorting transistor means, formed within the floating well means, for conducting current between the second input and the well tap means in response to the enable signal being in the enable state to equalize voltages of the second input and the floating well means; and well active-bias means, coupled to the well tap means, for biasing the floating well means to a supply voltage in response to the enable signal being in the isolating state.

12. The bus switch of claim 11 wherein the well tap means comprises:

metal line means for conducting current;

diffusion tap means, having a same polarity type as the floating well means, for connecting to the metal line means.

13. The bus switch of claim 12 wherein the well active-bias means comprises:

biasing transistor means, formed outside the floating well means, for conducting current between the supply voltage and the well tap means when the enable signal is in the isolating state.

14. The bus switch of claim 13 further comprising:

first inverter means, receiving an enable input, for generating an inverse enable signal;

second inverter means, receiving the inverse enable signal, for generating the enable signal.

15. The bus switch of claim 14 wherein the biasing transistor means has a gate that receives the inverse enable signal, while the bus-switch transistor means, the first well-shorting transistor means, and the second well-shorting transistor means each have a gate receiving the enable signal.

16. The bus switch of claim 15 wherein the biasing transistor means is an n-channel transistor:

wherein the bus-switch transistor means is an n-channel transistor;

wherein the first and second well-shorting transistor means are n-channel transistors;

wherein the supply voltage is a ground; and wherein the floating well means is a P-well.

17. The bus switch of claim 15 wherein the biasing transistor means is a p-channel transistor:

wherein the bus-switch transistor means is a p-channel transistor;

wherein the first and second well-shorting transistor means are p-channel transistors;

wherein the supply voltage is a power supply; and wherein the floating well means is an N-well.

18. A bus switch device comprising:

a first input;

a second input;

an enable signal;

a power supply;

a ground;

an isolated P-well not directly connected to either the power supply or to the ground;

a first P+ well tap formed within the isolated P-well;

a second P-well directly connected to the ground by a second P+ well tap;

a bus-switch n-channel transistor having a gate driven by the enable signal, a first N+ source/drain connected to the first input, and a second N+ source/drain connected to the second input, the bus-switch n-channel transistor formed within the isolated P-well;

a first well-shorting n-channel transistor having a gate driven by the enable signal or a logical equivalent to the enable signal, a first N+ source/drain connected to the first input, and a second N+ source/drain electrically connected to the isolated P-well through the first P+ well tap, the first well-shorting n-channel transistor formed within the isolated P-well;

a second well-shorting n-channel transistor having a gate driven by the enable signal or a logical equivalent to the enable signal, a second N+ source/drain connected to the second input, and a second N+ source/drain electrically connected to the isolated P-well, the second well-shorting n-channel transistor formed within the isolated P-well; and a biasing n-channel transistor, formed outside the isolated P-well, for connecting the isolated P-well to the ground when the enable signal disables the bus-switch n-channel transistor.

19. The bus switch device of claim 18 wherein a plurality of bus switch devices are integrated together onto a single silicon chip.

* * * * *